(12) United States Patent
Bauer et al.

(10) Patent No.: US 7,283,573 B2
(45) Date of Patent: Oct. 16, 2007

(54) OPTICAL MICROWAVE SOURCE

(75) Inventors: Stefan Bauer, Berlin (DE); Olaf Brox, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 237 days.

(21) Appl. No.: 10/495,937

(22) PCT Filed: Nov. 29, 2002

(86) PCT No.: PCT/DE02/04458

§ 371 (c)(1), (2), (4) Date: May 18, 2004

(87) PCT Pub. No.: WO03/049242

PCT Pub. Date: Jun. 12, 2003

(65) Prior Publication Data

US 2004/0258125 A1 Dec. 23, 2004

(30) Foreign Application Priority Data

Nov. 30, 2001 (DE) ................................ 101 60 502

(51) Int. Cl.
*H01S 5/00* (2006.01)
*H01S 3/08* (2006.01)

(52) U.S. Cl. ...................................... 372/50.1; 372/96

(58) Field of Classification Search ............... 372/50.1, 372/96
See application file for complete search history.

(56) References Cited

U.S. PATENT DOCUMENTS 4,984,243 A * 1/1991 Kagawa et al. .......... 372/46.01
6,031,860 A * 2/2000 Nitta et al. ............... 372/50.11

FOREIGN PATENT DOCUMENTS

EP 1087478 A1 3/2001

OTHER PUBLICATIONS

Sartorius et al.: "Dispersive Self-Q-Switching in Self-Pulsating DFB Lasers"; IEEE Journal of Quantum Electronics, vol. 33, No. 2; Feb. 1997; pp. 211-218.
Tager et al.: "High-Frequency Oscillations and Self-Mode Locking in Short External-Cavity Laser Diodes"; IEEE Journal of Quantum Electronics, vol. 30, No. 7, Jul. 1994; pp. 1553-1561.

* cited by examiner

*Primary Examiner*—Armando Rodriguez
(74) *Attorney, Agent, or Firm*—Karl Hormann

(57) ABSTRACT

A simple, tuned monolithic integrated component for the generation of optical microwaves in the frequency range of from 0.5 GHz to the THz range by means of an optical microwave source, embodied as a multi-section semiconductor laser, the sections of which are such as to be independently electrically controlled, with a single mode DFB laser, driven above the laser threshold and at least one monolithic integrated (external) cavity, having a passive phase control section and an active section.

21 Claims, 4 Drawing Sheets

OPTICAL MICROWAVE SOURCE

BACKGROUND OF THE INVENTION

1. Field of the Invention

The invention relates to an optical microwave source structured as a multi-section semiconductor laser the sections of which are structured to be separately electrically controllable.

2. The Prior Art.

Various types and arrangements of such multi-section semiconductor lasers have been described in the prior art.

A self-modulated laser with DFB/phase/DFB sections in which the second DFB (distributed feedback) section structured as a passive reflector and thus makes dispersive Q switching possible, has been described in IEEE Journal of Quantum Electronics, Vol. 33, No. 2, February 1997, pp. 211-218 in the paper "Dispersive Self-Q-Switching in Self-Pulsating DFB Lasers" by B. Sartorius, M. Moehrle, S. Reichenbacher, H. Preier, H.-J. Wuensche, U. Bandelow and in German patent specification DE 195 13 198. The laser is limited to frequencies in the range of the resonant frequency <20 GHz. The microwave frequency can be tuned within the confines of tuning the resonant frequency by the current in the actively driven DFB section.

European patent specification EP 1.087,478 describes a self-modulated laser with sections DFB/phase/DFB or DFB/DFB wherein both DFB sections are actively driven. The coupling of the two DFB modes in the complete resonator results in a microwave which is proportional to the spacing of the DFB modes of the different DFB sections. The limit of the upper cutoff frequency is determined by the distance of the modes of the two lasers from each other, rather than by their resonant frequencies. Because of the complexity of the structural components including two DFB lasers, the approach necessitates highly precise technology to ensure the fabrication of identical structural elements. Because of unavoidable accidental parameters such as, for instance, the phase relationship between lattices, the yield is very low and is further reduced by a lack of tunability.

In their paper "High-Frequency Oscillation and Self-Mode Locking in Short External-Cavity Laser Diodes" in IEEE Journal of Quantum Electronics, Vol. 30, No. 7, July 1994, pp. 1553-1561 Tager and Petermann have proposed a DFB laser with an integrated passive cavity. This type of structural component avoids the technological problems of the approach described supra. In this structure, the upper microwave frequency is significantly reduced by the optical losses in the integrated passive cavity and is limited to 30 GHz.

The solutions for sources of optical microwaves mentioned in the prior art are either limited as regards their frequency or they are technologically very complex.

OBJECT OF THE INVENTION

It is, therefore, an object of the invention to propose a simple, tuneable, monolithically integrated structural component for generating optical microwaves in the frequency range from 0.5 GHz up the THz range.

SUMMARY OF THE INVENTION

In accordance with the invention, the object is accomplished by an optical microwave source structured as a multi-section semiconductor laser the sections of which are separately electrically controllable and which is provided with a single-mode laser driven above the laser threshold and with at least one monolithically integrated (external) cavity consisting of a passive phase control section and an active section, the multi-section laser being limited by two facets the reflectivity of at least one of which being >0, and wherein passive and active sections are connected to the DFB section by a common waveguide, the active section being provided with means for amplifying the wave reflected in the multi-section semiconductor and the passive section being provided with means for changing the phase position of the reflected wave in the multi-section semiconductor laser.

The levels of feedback power attainable with the microwave source in accordance with the invention cannot be attained with entirely passive external cavities. Applying optical amplifiers in the external monolithically integrated cavity leads to an increase in the permissible phase rotations of the feedback light as well as in the attainable microwave frequencies. At the same time, it is entirely possible in the arrangement in accordance with the invention, which constitutes a component of rigid geometries, by operating parameters to control the frequency during operation. In this connection, the sequence in which the passive and the active section are arranged relative to the DFB laser is of no consequence.

Feedback of the laser light into the DFB section leads to the initiation of two longitudinal modes within the entire resonator. The beat between these modes results in a high frequency optical microwave signal, the length of the integrated cavity being selected in accordance with the desired microwave frequency range. The design parameter is set during fabrication of the structural component. $f_{rf} < 1/T_0$ applies for the maximum attainable microwave frequency, $T_0$ being the turn-around time in the monolithically integrated external cavity.

The parameter determinative of tuning the microwave frequency is the power of the optical feedback into the DFB laser. The power of the optical feedback is defined by the reflectivity of the final facet, by the optical losses in the integrated (external) cavity as well as by the optical amplification of the optically active section which in accordance with the invention is arranged within the integrated (external) cavity. In a given component, the reflectivity of the final facet as well as the optical losses in the integrated (external) cavity can either not be varied at all or insignificantly only. They are, therefore, not suitable for controlled tuning of the microwave frequency.

By contrast, in the microwave source in accordance with the invention, the tuning capacity of the microwave frequency is possible by controlled optical amplification of the optically active section integrated in the external cavity. The power of the reflected wave and, therefore, of the microwave frequency is controlled by the amplification by the current in the active section. The amplification of this section is sufficient to compensate for, and last but not least to amplify, the occurring losses suffered by the optical wave when passing through the monolithically integrated external cavity (losses at the section borders, absorption in the passive section, reflectivity of the final facet).

Since a change of amplification in the active section results in a change of the optical phase of the reflected wave, an additional control parameter is required. This control parameter, which is the injected current in the phase section, changes the refractive index and, therefore, the phase of the reflected optical wave. The injected current in the phase section thus serves to compensate the phase position of the reflected optical wave whenever the amplification of the active section changes. It is only because it is possible to compensate the phase position of the reflected wave that the microwave frequency can be tuned.

In certain embodiments of the invention, either one external cavity with a non-reflecting final DFB facet is monolithically integrated in the multi-section semiconductor laser or two external cavities are monolithically integrated in the multi-section semiconductor laser, the reflectively of both facets being >0. The reflectivity is increased by coating of the facets.

In another embodiment, the length of the monolithically integrated cavity is defined by the upper cutoff value of the microwave frequency range to be realized.

By sacrificing a degree of freedom of function optimization, it is possible to propose a simplified arrangement of a microwave source consisting of only two sections, namely the DFB laser and the active section optically coupled to each other by a common waveguide.

Temperature stabilization means in another embodiment of the multi-section semiconductor laser ensure stable operation in the frequency range of the microwave source in accordance with the invention.

The following embodiments of the optical microwave source are closely related to their application as a data or pulse source.

Accordingly, in two embodiments the multi-section semiconductor laser is additionally provided either with an integrated modulator section or with an external modulator at its output. In the case of the former, the absorption of the modulator is modulated by a high frequency voltage resulting in the superposition of a data signal on the microwave pulses. In the case of the latter, the modulator may be connected to the pulse source, for instance by open optics or by a fiber connection. By such an embodiment the microwave source and the modulator may be separately optimized for improved functioning. For specific pulse shaping, e.g. shortening of the microwave pulses, the downstream or the integrated modulator may be additionally provided, for instance, with means for electrically operating the modulator or for reducing the service life of the charge carrier, for instance, by incorporating lattice defects by means of irradiation. Pulse shaping may also be provided by appropriate means downstream from the multi-section semiconductor laser. For instance, an amplifier and a fiber or a fiber of nonlinear optical properties may be connected to the output of the microwave source in accordance with the invention. Utilizing the nonlinearity in optical waveguides results in shortening the temporal pulse duration.

The following embodiments of the solution in accordance with the invention relate to the DFB section. Thus, the DFB laser is an index-coupled or a gain-coupled laser provided, for instance, with a lattice with integrated phase jumps. This increases the yield of microwaves of a desired frequency range because other modes originating in the DFB section can be suppressed by the arrangement in accordance with the invention.

The effect of the inhomogeneous lattice may be realized in the arrangement in accordance with the invention either by a variable longitudinal lattice period in the DFB section, or by changing the lateral width of the section of the waveguide extending in the DFB section.

Another embodiment provides for structuring the means for energizing the DFB laser in sections. The sectional current contacts and varying operating currents of the DFB sub-sections make possible a specific mode control of the DFB laser.

As provided in a further embodiment of the invention, the refractive index in the passive phase section can be changed by means for heating the waveguide arranged laterally thereof in the passive or active section. In this manner, the phase relation of the feedback laser light may be affected thermally. Thermal tuning may take place in the optically passive as well as in the active section of the external cavity.

In another embodiment, the microwave source is provided with means invention provided modulating means;

FIG. 1D schematically depicts a planar waveguide with a tapered section in one of the sections of the semiconductor laser in accordance with the invention;

Figure 6:
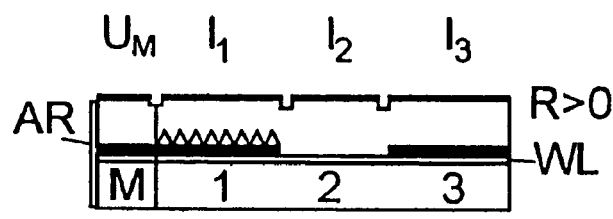
Figure 7:
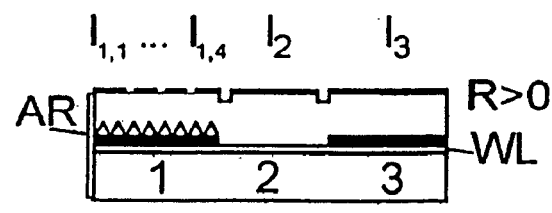
Figure 8:
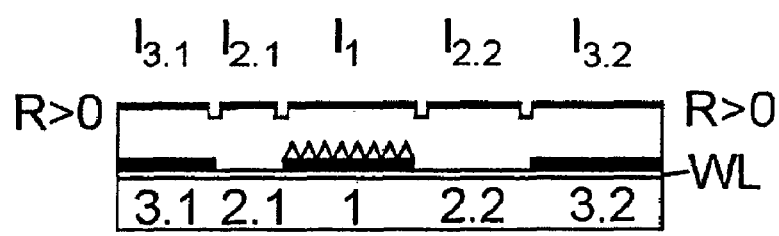
Figure 8A:
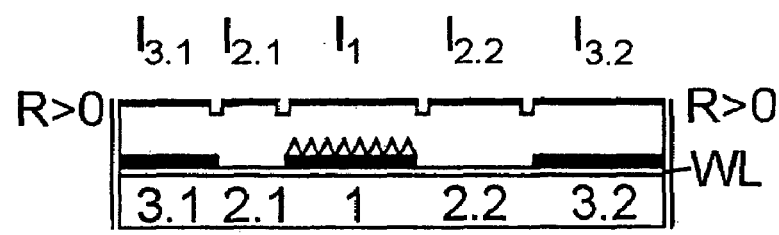

FIG. 6 schematically depicts a second embodiment of a microwave source in accordance with the invention with an integrated modulator;

FIG. 7 schematically depicts a third embodiment of a microwave source in accordance with the invention with a sectioned DFB laser;

FIG. 8 schematically depicts a fourth embodiment of a microwave source in accordance with the invention with two integrated external cavities; and FIG. 8A schematically depicts a semiconductor laser in accordance with the invention with two reflectors.

DETAILED DESCRIPTION OF THE PREFERRED EMBODIMENTS

Figure 1:
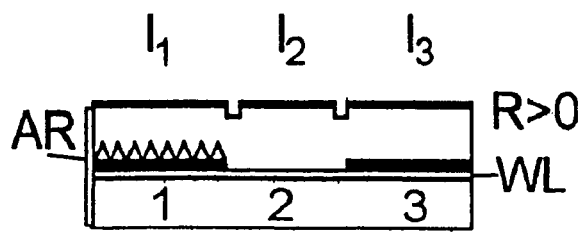

A first embodiment of a microwave source in accordance with the invention is schematically shown in FIG. 1. It is a semiconductor laser which has an external cavity monolithically integrated into it and which thus consists of three sections. Sections 1, 2 and 3 are connected by a common waveguide WL. Section 1 denominates the DFB laser driven by current $I_1$, section 2 denominates the passive section driven by $I_2$, and section 3 denominates the active section driven by current $I_3$. The DFB facet may be provided with an antireflection coating AR; the reflectivity R of the final facet is greater than 0. In the present embodiment, the length of section 1 is 200 μm, that of section 2 is 550 μm, and the length of section 3 is 250 μm. The length of the external cavity is thus 800 μm which results in an upper microwave frequency of about 58 GHz. The Bragg wavelength of the DFB laser section for synchronization of a modulated current source in particular. It allows synchronization by modulating the currents by the pulse frequency of the microwave. The modulation is carried out at the DFB section or at the active section.

Where as provided in one embodiment, the microwave source is provided with additional reflectors, which may be realized by etching of the waveguide between individual sections, a plurality of cavities will be formed in the component which ensure greater flexibility of the component.

For effectively coupling light into the downstream component the microwave source is provided with an integrated tapered area of transition. With a specifically configured taper there is no need for a fiber provided with a lens. In that case a split fiber could be used which is non-reflective for the length of the fiber wavelength.

DESCRIPTION OF THE SEVERAL DRAWINGS

Figure 1A:
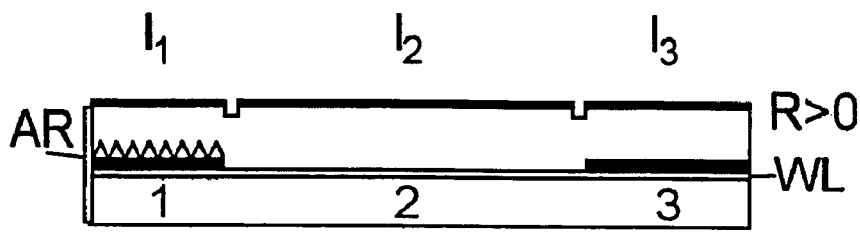
Figure 1B:
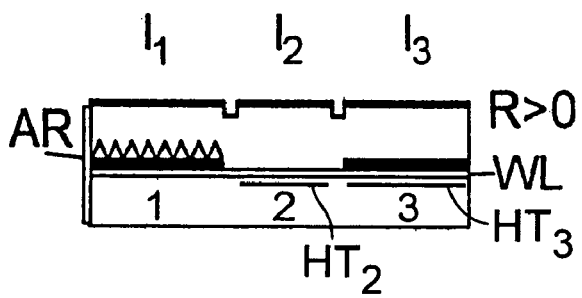
Figure 1C:
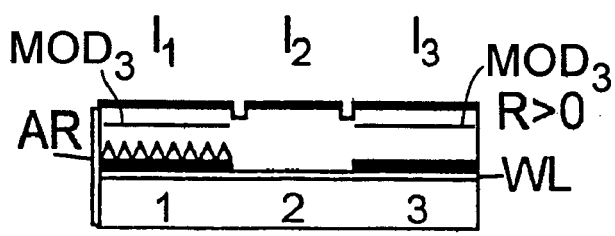
Figure 1D:
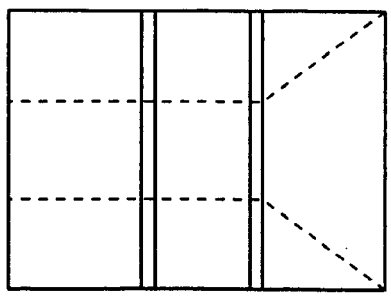

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 1 schematically depicts a first embodiment of a three section semiconductor laser;

FIG. 1A schematically depicts a semiconductor laser with three sections of different lengths;

FIG. 1B schematically depicts a semiconductor laser in accordance with the invention provided with heating means;

FIG. 1C schematically depicts a semiconductor laser in accordance with the 1 is 1538 nm, the coupling coefficient κ is 130 cm$^{-1}$. The end facet of the DFB laser section 1 is antireflectively coated, the end facet of the active section 3 is a split surface with a reflectivity of R~0.3. For setting a frequency of 37.6 GHz, the three section semiconductor laser is driven by $I_1$=90 mA, $I_2$=0.5 mA and $I_3$=95 mA.

Figure 2:
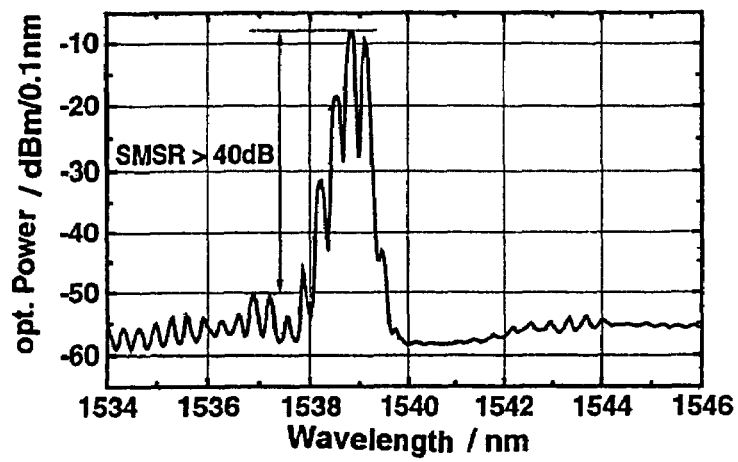
FIG. 2 depicts the optical spectrum of the microwave source in accordance with FIG. 1.

FIG. 2 depicts the optical spectrum (optical power as a function of wavelength) of the microwave source depicted in FIG. 1. The currents $I_1$, $I_2$, and $I_3$ are set in the manner already described. The side mode suppression ratio SMSR is greater than 40 dB. The spacing between the major modes corresponds to a microwave frequency of 37.6 GHz.

Figure 3:
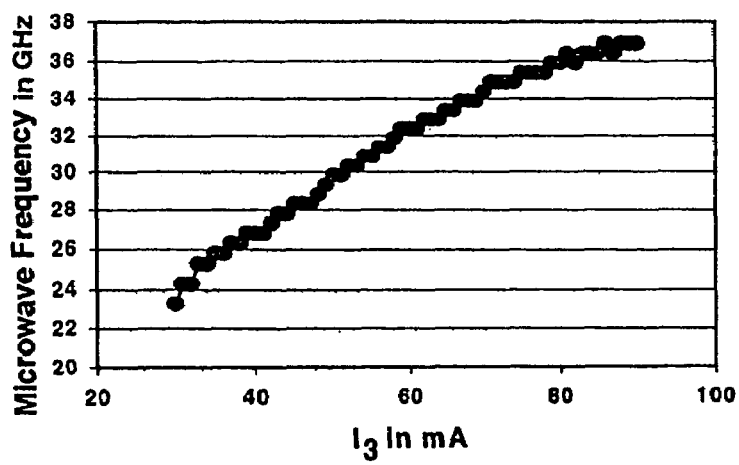
FIG. 3 depicts the tuning range of the microwave source of FIG. 1.

The tuning range (microwave frequency as a function of the current $I_3$ driving section 3) of the three section optical microwave source of FIG. 1 is shown in FIG. 3. In this example, the DFB laser section 1 was driven by a constant current $I_1$=100 mA. For maintaining the optical phase of the reflected wave in the external cavity constant, the current $I_3$ in the active section 3 is readjusted.

Figure 4:
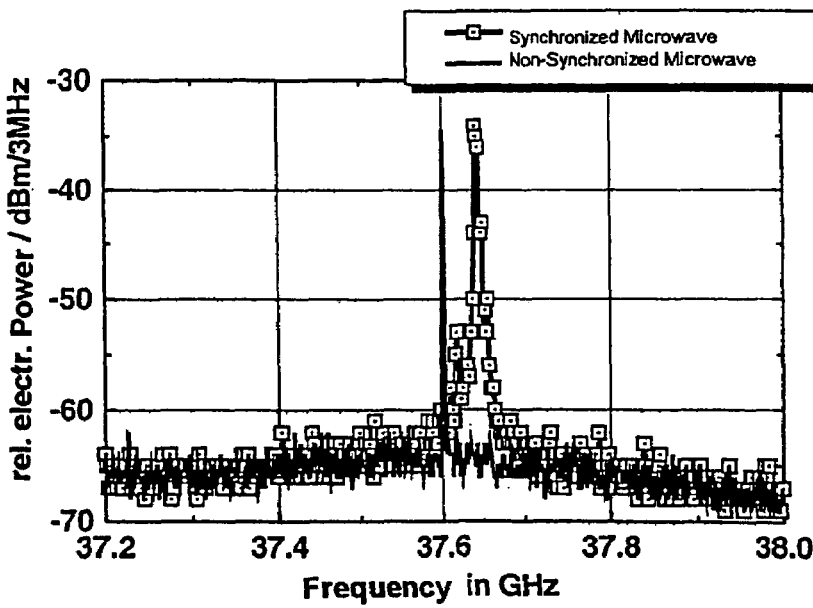
FIG. 4 shows the synchronization behavior of the microwave source of FIG. 1.

FIG. 4 shows the dependence of the relative power of the microwave source of FIG. 1 upon the frequency. The two measurement curves respectively show the unsynchronized microwave with a frequency of 37.62 GHz based upon a measurement taken with an electrical spectrum analyzer (solid line) and, marked by squares the completely synchronized microwave. For this purpose an optical data signal of 0 dBm was coupled into the microwave source in accordance with the invention which synchronizes to the frequency of 37.6 GHz.

Figure 5:
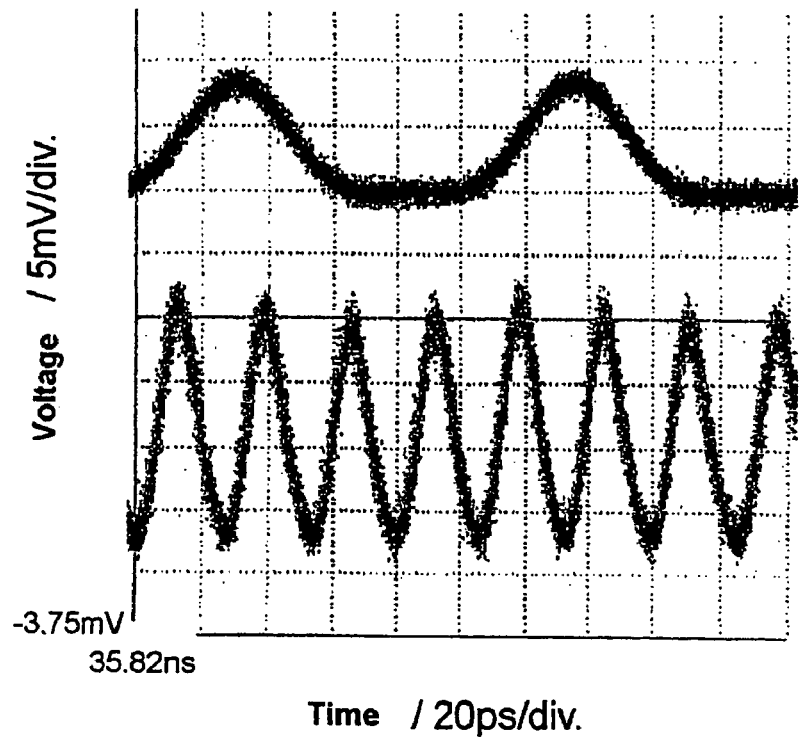
FIG. 5 shows a pulse train synchronized a microwave source of FIG. 1.

For synchronizing the microwave source a pulse train of a subharmonic frequency f/n, e.g. 9.4 GHz, which is a fracture of the desired clock pulse, may for instance be injected into the microwave source, as is shown in FIG. 5 by the upper pulse train. The lower pulse train in the figure depicts the synchronized microwave source at a frequency of 37.6 GHz. The extinction amounts to about 6 dB, the value being here limited by the band width of the measuring system.

An embodiment in which the microwave source in accordance with the invention is to be used as a data or pulse source may be realized with an integrated modulator. Such an embodiment consisting of a three section semiconductor laser with sections 1, 2 and 3 and appurtenant currents $I_1$, $I_2$ and $I_3$, as previously described in connection with FIG. 13, and of an integrated modulator section M the absorption of which is modulated by a high frequency voltage $U_m$, is shown in FIG. 6. The effect of the modulation is the superposition of a data signal on the microwave pulses.

In FIG. 7, the current contacts in the DFB section 1 of the microwave source shown in FIG. 1 are divided. The divided contacts allow energization of subsections of the DFB section 1 in a specific manner with different operating currents $I_{1,1}$ ... $I_{1,4}$ for a defined mode control of the DFB laser 1.

FIG. 8 depicts an embodiment of the microwave source in accordance with the invention provided with two integrated cavities. At either side of the DFB laser 1 there is arranged an integrated cavity each provided with a passive section 2.1 or 2.2 and an active section 3.1 or 3.2. The cavities may be structured to be of different lengths and they may also be structured differently. The passive and active sections may be arranged in any desired sequence.

The arrangement in accordance with the invention constitutes an integrated microwave source which compared to hybrid microwave sources operates in a more stable manner. Compared to components with detuned lattices (e.g. DFB/passive section/DFB or DFB/DFB), it can be fabricated by simplified technologies. The microwave source allows simple control of the component since thermal effects do not change the correlation between several lattices. Nonreflectivity is not absolutely required in the arrangement in accordance with the invention. Unlike the mode-coupled lasers, the frequency of the microwave source in accordance with the invention can be tuned by the currents of its active and passive sections. The mentioned mode coupling which has already been mentioned results only in low frequency noise. The microwave source in accordance with the invention makes possible to realize a large modulation increase.

What is claimed is:

1. An optical microwave source structured as a semiconductor laser comprising a plurality of separately electrically controllable sections, comprising:
    a single-mode DFB (distributed feedback) laser operated above the threshold thereof;
    at least one monolithically integrated external cavity comprising a passive phase control section and an active section;
    a common waveguide for connecting the passive phase control section and the active section to the DFB laser;
    means associated with the active section for amplifying any wave returning to the laser;
    means associated with the passive section for changing the phase position of the wave returning to the laser; and
    two facets limiting the semiconductor laser, at least one of the facets having a reflectivity greater than 0.

2. The optical microwave source of claim 1, wherein an external cavity is monolithically integrated in the multi-section semiconductor laser comprising a non-reflective DFB facet.

3. The optical microwave source of claim 1, wherein two external cavities are monolithically integrated in the multi-section semiconductor laser and wherein the reflectivity of both facets is greater than 0.

4. The optical microwave source of claim 1, wherein the reflectivity greater than 0 is provided by coating of the facets.

5. The optical microwave source of claim 1, wherein the monolithically integrated cavity is of a length determined by the upper threshold value of the microwave frequency range to be realized.

6. The optical microwave source of claim 1, further comprising means for driving the multi-section semiconductor laser at a stable temperature.

7. The optical microwave source of claim 1, wherein the multi-section semiconductor laser further comprises an integrated modulator section.

8. The optical microwave source of claim 1, further comprising an external modulator at the output of the multi-section semiconductor laser.

9. The optical microwave source of claim 7, wherein the modulator comprises pulse shortening means.

10. The optical microwave source of claim 8, wherein the modulator comprises pulse shortening means.

11. The optical microwave source of claim 1, further comprising pulse-shaping means at the output of the multi-section semiconductor laser.

12. The optical microwave source of claim 1, wherein the DFB laser is an index-coupled laser.

13. The optical microwave source of claim 1, wherein the DFB laser is a gain-coupled laser.

14. The optical microwave source of claim 1, wherein the DFB laser comprises a grid with integrated phase jumps.

15. The optical microwave source of claim 1, wherein the DFB laser comprises a changing longitudinal grid period.

16. The optical microwave source of claim 1, wherein the lateral width of the waveguide section in the DFB section varies.

17. The optical microwave source of claim 1, wherein the means for controlling the DFB laser are sectionally structured.

18. The optical microwave source of claim 1, further comprising means for heating the waveguide are disposed adjacent thereto in one of the passive and active sections.

19. The optical microwave source of claim 1, further comprising a modulated current source for synchronization.

20. The optical microwave source of claim 1, further comprising additional reflective means.

21. The optical microwave source of claim 1, further comprising a tapered transition area for effectively coupling light into a subsequent component.

* * * * *